(12) United States Patent
Koifman et al.

(10) Patent No.: US 6,275,178 B1
(45) Date of Patent: Aug. 14, 2001

(54) VARIABLE CAPACITANCE VOLTAGE SHIFTER AND AMPLIFIER AND A METHOD FOR AMPLIFYING AND SHIFTING VOLTAGE

(75) Inventors: Vladimir Koifman, Rishon-Lezion; Yachin Afek, Cfar-Sabe, both of (IL)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/492,372

(22) Filed: Jan. 27, 2000

(51) Int. Cl.[7] .................................................. H03M 3/00
(52) U.S. Cl. ......................... 341/143; 341/172; 257/312
(58) Field of Search .................................... 341/143, 172; 257/312, 313; 320/166

(56) References Cited

U.S. PATENT DOCUMENTS

| | | | |
|---|---|---|---|
| 3,855,581 | * 12/1974 | Greene | 257/312 |
| 3,890,635 | * 6/1975 | Engeler | 257/312 |
| 4,471,244 | 9/1984 | Maples | 307/530 |
| 5,087,834 | 2/1992 | Tsay | 307/443 |
| 5,130,564 | * 7/1992 | Sin | 327/264 |
| 5,132,560 | 7/1992 | Kane | 307/355 |
| 5,408,235 | * 4/1995 | Doyle et al. | 341/143 |
| 5,436,866 | 7/1995 | Jang | 365/208 |
| 5,687,115 | 11/1997 | Wong | 365/185.03 |
| 5,751,177 | 5/1998 | Tanoi | 327/333 |
| 5,790,063 | 8/1998 | Koifman | 341/155 |
| 5,889,389 | 3/1999 | Bothra | 320/166 |
| 5,962,887 | * 10/1999 | Manning et al. | 257/313 |
| 6,037,887 | * 3/2000 | Wu et al. | 341/143 |

* cited by examiner

Primary Examiner—Howard L. Williams

(57) ABSTRACT

A high-speed voltage shifter/amplifier, a sigma delta modulator having a high-speed voltage shifter/amplifier and method for performing an amplification/a voltage shift to an analog signal. The voltage shifter/amplifier comprising a capacitor and an isolator; the isolator is coupled to the capacitor. The capacitor is adapted to receive a control signal, to be charged by an input signal, and to provide an output signal. The capacitor has a capacitance that is responsive to a level of the control signal, and a change in the capacitance of the capacitor forces a change in a level of the output signal; and the isolator is adapted to electrically isolate the capacitor when the capacitance is changed.

16 Claims, 5 Drawing Sheets

US 6,275,178 B1

VARIABLE CAPACITANCE VOLTAGE SHIFTER AND AMPLIFIER AND A METHOD FOR AMPLIFYING AND SHIFTING VOLTAGE

FIELD OF THE INVENTION

A voltage shifter and amplifier having a variable capacitance, and a method for amplifying and shifting voltage, and especially a voltage shifter comprising of a variable capacitor and an isolator in applications such as sigma delta converters.

BACKGROUND OF THE INVENTION

Amplifiers and voltage shifters are extensively used in integrated circuits. There are various types of amplifiers such as feedback amplifiers, differential amplifiers and operational amplifiers. They can be used in circuits that handle either digital signals, analog signals and mixed signals. For example, voltage shifters and amplifiers are used to shift the voltage level or amplify an input signal to be send to a comparator, enabling a more accurate comparison between the amplified/shifted input signal and another signal provided to the comparator. U.S. Pat. No. 4,471,244 of Maples, U.S. Pat. No. 5,087,834 of Tsay, U.S. Pat. No. 5436866 of Jang and U.S. Pat. No. 5,889,389 of Bothra demonstrate a small portion of the various uses of voltage shifters and amplifiers.

Many electrical devices have integrated circuits that handle mixed signals. A cellular phone is one of these devices. Cellular phone often have a sigma delta modulator, which are used to convert signals between analog and digital domains.

Sigma delta modulators comprise of a noise shaping element, a comparator and a feedback loop. Usually, an output of the noise shaping element is coupled to an input of the comparator, and an output of the comparator is coupled via a feedback loop to an input of the noise shaping element. When the noise shaping element provides a single output signal, the comparator compares between the single output signal and a reference signal. When the noise shaping element provides two differential output signals, the comparator compares one differential output signal to the other.

The noise shaping element can have either a discrete or a continuous transfer function. A common noise shaping element is an integrator. A sigma delta modulator having an integrator receives an analog signal, provides the analog signal to an integrator for integrating the analog signal, sends an output signal of the integrator to a comparator for comparing the output signal to a reference signal, and produces a digital output signal which is related to the analog signal, the digital output signal is also provided to a feedback circuit within the sigma delta modulator. A premium is placed upon the speed and accuracy of the sigma delta modulators, which are partly limited by the comparator accuracy. On one hand there is a need to perform an accurate comparison, and not to output erroneous results and on the other hand accurate measurements may be time consuming, thus limiting the speed of the sigma delta modulator.

A premium is placed upon low energy consumption, especially in electrical devices such as cellular phones powered by batteries. Most prior art amplifiers/voltage shifters were relatively energy consuming, and were comprised of a relative large number of components. Furthermore, such amplifiers and voltage shifters consumed valuable die area. A premium is also placed upon components that can work at a very high frequency, especially in the network and the telecommunication fields.

A premium is also placed upon accuracy and the ability of a device to work in relatively noisy environments. For example, the comparator within the sigma delta modulator has to determine whether the analog input signal is above or below a reference signal. If the analog input signal is very close to the threshold, and especially when an unwanted noise is added to the analog input signal, the comparator can produce an erroneous result. Usually, the accuracy of the comparator can be improved by amplifying the analog signal, but the amplification involves larger energy consumption, and most of the amplifiers tend to add an unwanted offset signal to the analog signal.

There is a need of a compact-sized, high-speed and low energy consuming voltage shifter/amplifier. There is a need for a high speed and accurate sigma delta modulator that has a compact size- and low-energy consuming voltage shifter/amplifier.

BRIEF DESCRIPTION OF THE DRAWINGS

While the invention is pointed out with particularity in the appended claims, other features of the invention are disclosed by the following detailed description taken in conjunction with the accompanying drawings, in which:

DETAILED DESCRIPTION OF THE DRAWINGS

It should be noted that the particular terms and expressions employed and the particular structural and operational details disclosed in the detailed description and accompanying drawings are for illustrative purposes only and are not intended to in any way limit the scope of the invention as described in the appended claims.

An aspect of the invention is a voltage shifter/amplifier having low power consumption. A further aspect of the invention is a voltage shifter/amplifier that is adapted to change its capacitance and accordingly to change the voltage across the capacitor, with negligible delay. The change of capacitance involves at most a negligible loss of charge and does not add an unwanted offset signal to the analog signal. The voltage shifter/amplifier is adapted to operate at very high frequency. Yet another aspect of the invention is a voltage shifter/amplifier that is comprised of two CMOS devices—a transistor, operating as an isolator and a capacitor.

A further aspect of the invention is a high-speed and accurate sigma delta modulator that comprises of a voltage shifter/comparator.

Figure 1:
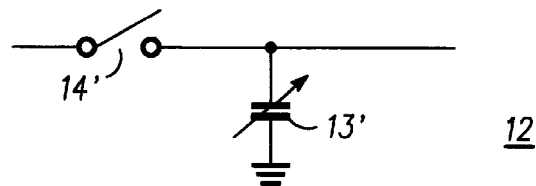
FIG. 1 is a schematic description of a voltage shifter/amplifier according to a preferred embodiment of the invention.

FIG. 1 is a schematic description of a voltage shifter/amplifier 12' according to a preferred embodiment of the invention a high-speed that is conveniently comprised of controlled capacitor 13' and isolator 14'. Isolator 14' is coupled to controlled capacitor 13'. Controlled capacitor 13' is adapted to be charged by an input signal, and to provide an output signal. Controlled capacitor 13' has a capacitance that is responsive to a level of the control signal, and a change in the capacitance of the capacitor forces a change in a level of the output signal. Isolator 14' is adapted to electrically isolate controlled capacitor 13' when the capacitance is changed. An example of such a capacitor is shown in FIGS. 3–6. For convenience of explanation it is assumed that controlled capacitor 13' is a CMOS device, but other devices can be replace it.

The term 'transistor' is used hereinafter to refer to any device having main electrodes (e.g., sources (S) and drains (D)) and a control electrode (e.g., gates (G)). The transistors of the described preferred embodiment are field-effect transistors (FET). As a person of skill in the art will understand, other transistors can also be used.

Figure 3:
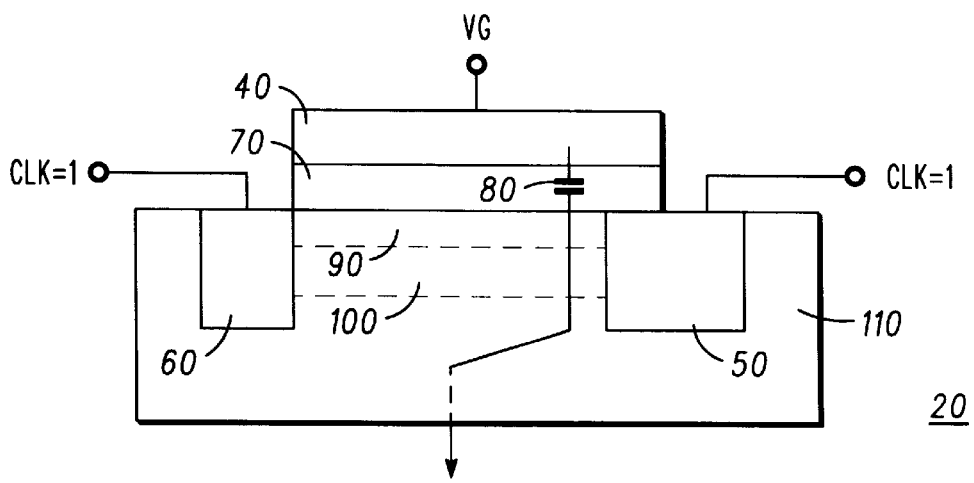
FIGS. 3–6 are schematic descriptions of CMOS n-channel transistors, according to a preferred embodiment of the invention.
Figure 4:
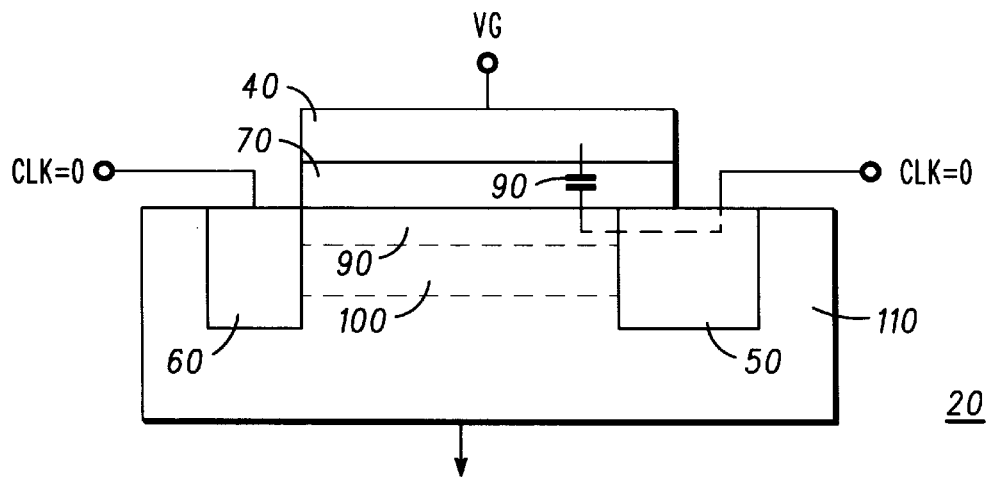
Figure 5:
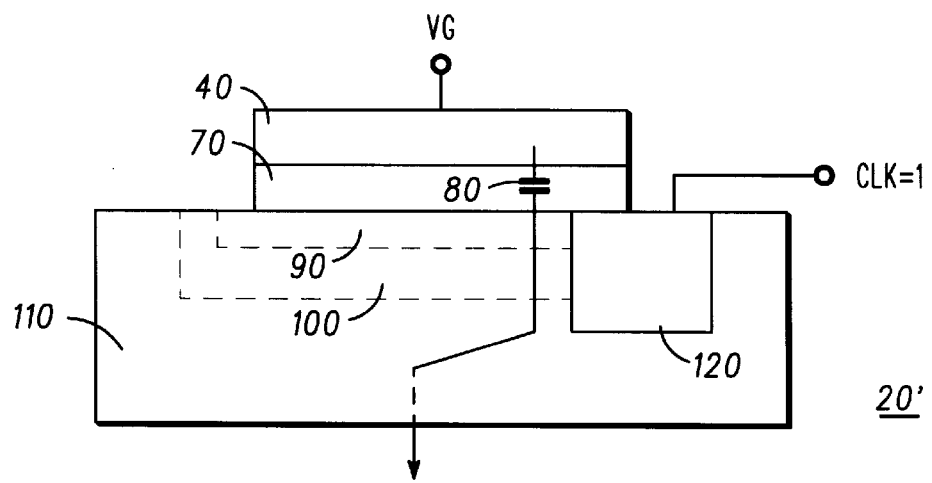
Figure 6:
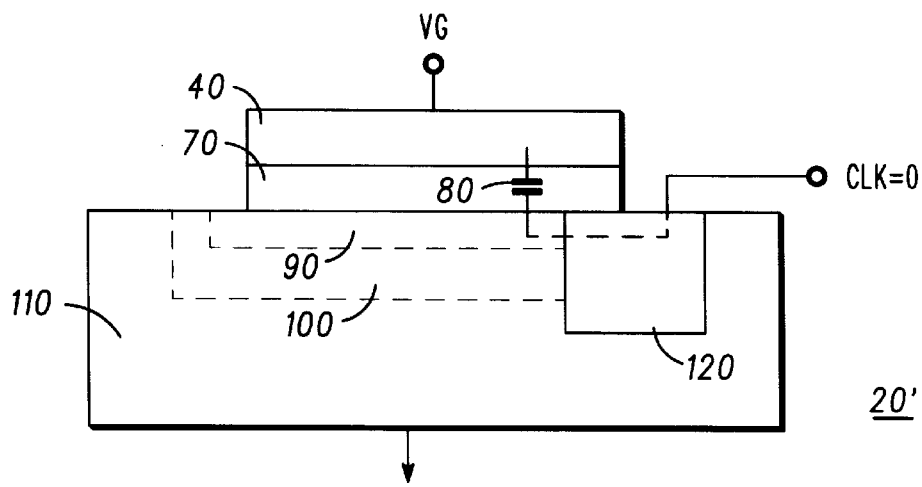

FIG. 3 and FIG. 4 are a schematic description of a CMOS n-channel transistor CT1 20, which operates as a variable capacitor. CT1 20 is referred to as capacitor CT1 20. FIG. 5 and FIG. 6 are a schematic description of a CMOS capacitor CC1 20', that is analogues to CT1 but has a single diffusion region 120 instead of two diffusion layers of CT1 20—drain 50 and source 60.

Figure 2:
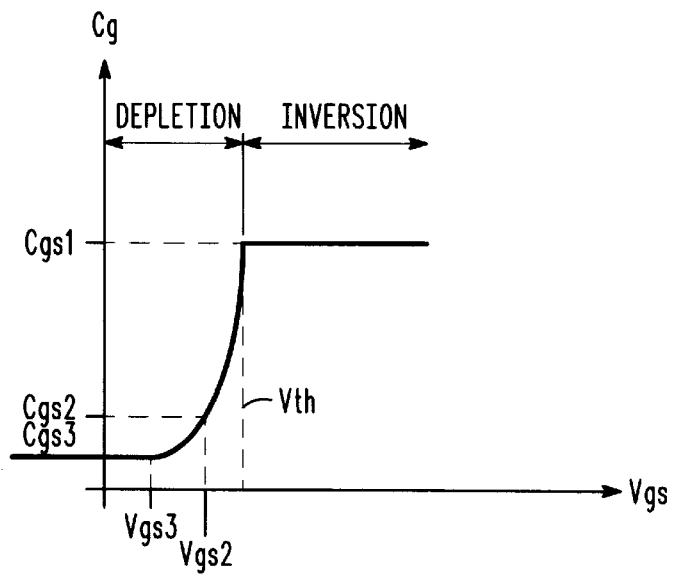
FIG. 2 is a schematic characteristic of the capacitance of a capacitor, according to a preferred embodiment of the invention.

FIG. 2 is a schematic characteristic of the capacitance of a CT1 20 of FIG. 3 and FIG. 4.

Capacitor CT1 20 is comprised of a p-type substrate 30, a gate 40, an n-type drain 50 an n-type source 60 and an insulator 70. Insulator 70 is coupled to gate 40, substrate 30 and can also be coupled to drain 50 and/or source 60. Substrate 30 partly surrounds source 60 and drain 50. Conveniently, substrate 30 is coupled to the ground, source 60 and drain 50 are coupled to a control signal (referred to as CLK), and gate 40 is coupled isolator 14 (shown in FIG. 1). Gate 40 is adapted to receive an input signal IS. Conveniently, the potential difference between the signal applied to gate 40 and CLK is used to change the capacitance of CT1 20 and to control isolator 14. Preferably, and as can seen in FIG. 2, when the level of CLK is high "1" then Vgs=Vg−CLK=Vs-"1"<Vth and CT1 20 is operating in a depletion mode. When the level of CLK is low "0" then Vgs=Vg−CLK=Vs-"0">Vth, CT1 20 is operating in an inversion mode.

When CT1 20 is in either the depletion mode or the inversion mode, substrate 30 has two electrically charged regions and a depletion region 100. A first region 90 having a negative charge and a second region 110 having a positive charge. First region 90 is formed between insulator 70 and the depletion region 100. Depletion layer is formed between first region 90 source 50 and gate 60 and second region 110. Second region 110 is couple to the ground. When CT1 20 is in the depletion mode the dominant capacitance between gate 40 and the ground is the capacitance Cgs 80 between gate 40 and second region 110, the second region 110 is coupled to the ground. When CT1 20 is in the inversion mode the dominant capacitance between gate 40 and the ground is the capacitance Cgae 90 between gate 40 and first region 90, first region is coupled to the ground via drain 50 and source. As can be seen by FIG. 2 Cgs 80>Cgae 90 thus, when CT1 20 changes its mode from inversion mode to depletion mode, the capacitance between gate 40 and the ground changes.

When Vgs is greater than a threshold level Vth, CT1 20 is in inversion mode. The capacitance is constant and equals Cgs 80. When Vgs is smaller than Vth CT1 20 is in the depletion mode, and has a capacitance Cgs that reflects Vgs. Larger Vgs value result in higher Cgs values.

Input signal IS, provided to gate 40 and charges Cgs 80. A voltage Vgg across CT1 20, Vgg being the voltage difference between gate 40 and the ground, reaches a first level Vgg1, before CT1 20 is isolated. When CLK turns to "1" and isolator 13 isolates CT1 20, CT1 20 changes its operation mode from inversion mode to depletion mode, and the electrical charge stored within Cgs 80 is immediately sent to Cgae 90. Accordingly, the voltage across CT1 20 reaches a second level Vgg2.

Preferably, the transfer of charge from Cgs 80 to Cgae 90 involves no sampled signal charge losses, so that the change in capacitance is reflected by an change in the level of Vgg. Even in the presence of some losses Vgg2 is usually greater than Vgg1 because of the reduction of the capacitance of CT1 20.

Figure 7:
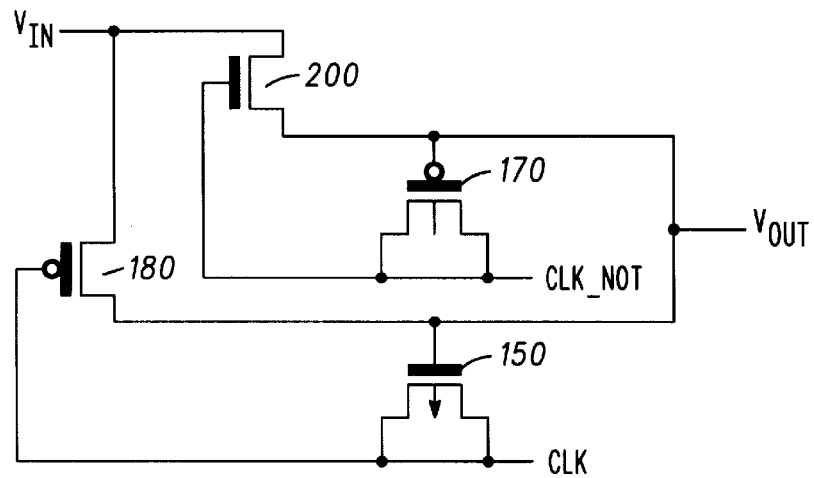
FIG. 7 is a schematic figure of an amplifier that amplifies a difference between an input signal to a predetermined reference voltage, according to a preferred embodiment of the invention.

FIG. 7 is a schematic figure of an amplifier 130 that amplifies a difference between an input signal to a predetermined reference voltage.

Amplifier 130 comprises of two capacitors CT2 150 and CT3 160 and two isolators SW2 180 and SW3 190. For convenience of explanation it is assumed that CT2 150 and CT3 160 are analogues to CT1 20 of FIG. 4 and FIG. 5, and that SW2 180 and CT3 160 are p-channel CMOS transistors.

CT2 150, CT3 160, SW2 180 and SW3 190 have substrates or wells 152. 162, 182 and 192 accordingly, sources 154, 164, 184 and 194 accordingly, drains 156, 166, 186 and 196 accordingly and gates 158, 168, 188 and 198 accordingly. Wells 162 and 182 are coupled to a power source Vcc (not shown in FIG. 7). Substrates 152 and 192 are coupled to the ground. Gate 188, source and drain 154 and 156 are adapted to receive a control signal CLK_NOT. CLK_NOT is an inverted CLK control signal. Gate 198, source and drain 164 and 166 are adapted to receive control signal CLK. Gate 158, gate 168, source 184 and source 194 are coupled to each other.

When CLK="0" and CLK_NOT="1" CT2 150 and CT3 190 are in an inversion mode. SW2 180 and SW3 190 allow CT2 150 and CT3 190 to be charged by a current that is derived from input signal Vin, so that the voltage at gate 158 and gate 168 reach a first level denoted as Vgg11. The voltage across a capacitance Cgs2 151 between gate 154 and a second region 155 within substrate 152 equals Vgg11. The voltage across a capacitance Cgs3 161 between gate 164 and a second region 165 within substrate 162 equals (Vcc−Vgg1), Vcc is provided by a power source. Second region 155 is analogues to second region 110 of CT1 20 of FIG. 4 and FIG. 5. Second region 165 is analogues to second region 110 but is made of n-type negative charged material. Vout, provided by gates 154 and 164 tracks Vin.

When CLK changes from "0" to "1" and CLK_NOT changes from "1" to"0", SW2 180 and SW3 190 isolate CT2 150 and CT3 160. The capacitance of CT2 150 and CT3 160 change from Cgs2 151 and Cgs3 161 to capacitance Cgae2 (between gate 154 and a first region 157 within substrate 152) and Cgae3 (between gate 164 and a first region 167 within well 122).

Cgae2<Cgs2 and Cgae3<Cgs3, so that the change in capacitance of CT2 150 forces Vout to rise, while the change in capacitance of CT3 160 forces Vout to fall. Vout reaches a level Vout2 that reflects the level of Vgg1 and a ratio between Cgae2 and Cgae3.

For example, if Vcc=5v, Cgae2/Cgs2=3, Cgac3/Cgs3–3 and Cgae2=Cgae3, Vin=2v.Before SW2 180 and SW3 isolate CT2 150 and CT3 160, Vout=2.5v, the voltage across Cgs2 equals 2v, and the voltage across Cgs3 equals Vcc−Vin=3 v. Vin deviates by 0.5 v from a reference level of 2.5 v.

After CT2 150 and CT3 160 are isolated they try to shift/amplify the voltage difference on their capacitance by a factor of 3 but because they are coupled to each other Vout will equal 4 v. 4=2.5+3 (3−2.5). Vout deviates by 1.5 v (=0.5 v*3) from the reference voltage of 2.5 v.

Figure 8:
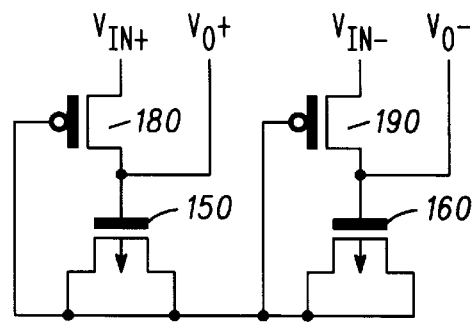
FIG. 8 is a schematic description of a differential amplifier, according to a preferred embodiment of the invention.

FIG. 8 is a schematic description of a differential amplifier 140 using two voltage shifters/amplifiers. Differential amplifier 140 comprises of two capacitors CT2 150 and CT4 170 and two isolators SW2 180 and SW4 200. Usually two loading capacitors (not shown in FIG. 8) are coupled to two differential outputs of differential amplifier 140. For convenience of explanation it is assumed that CT2 150 and CT4 170 are analogues to CT1 20 of FIG. 4 and FIG. 5, and that SW2 180 and SW4 are p-channel CMOS transistors.

Differential amplifier 140 receives a differential signal Vin=Vin+−Vin−, amplifies the difference between Vin+ and Vin− and provides, via the two differential outputs, a differential output signal Vout, wherein Vout=Vout+−Vin−. CT2 150 and SW2 180 receive Vin− and provide Vout−. CT4 170 and SW4 200 receive Vin+ and provide Vout+.

CT2 150, CT4 170, SW2 180 and SW4 200 have substrates or wells 152. 172, 182 and 202 accordingly, sources 154, 174, 184 and 204 accordingly, drains 156, 176, 186 and 206 accordingly and gates 158, 178 188 and 208 accordingly. Wells 182 and 202 are coupled to a power source (not shown in FIG. 8).

Drain 184 is adapted to receive Vin− and accordingly to charge CT2 150. Source 184 is coupled to gate 158, for either charging or isolating CT2 150. Gate 158 provides Vout−. Drain 204 is adapted to receive Vin+ and accordingly to charge CT4 170. Gates 188 and 208, drains 156 and 176 and sources 154 and 174 are adapted to receive CLK signal. Source 204 is coupled to gate 178, for either charging or isolating CT4 170. Gate 178 provides Vout+.

When CLK="0" SW4 200 and SW2 180 allow CT4 170 and CT2 150 to be charged by a current derived from Vin+ and Vin− accordingly. The charge is mainly stored in a capacitance between the gates and a second region in CT2 150 and CT4 170. The second region is analogues to second region 110 of CT1 20 of FIG. 3 and FIG. 4.

When CLK="1" SW4 200 and SW2 180 are in an accumulation mode, so that gates 158 and 178 are isolated. CT2 150 and CT4 170 change their capacitance and accordingly the voltage across them—the voltage difference between their gates and the ground changes accordingly. Vin+ is amplified by CT4 170 and Vin− is amplified by CT2 150, in a manner that the difference between Vin+ to Vout− is also amplified.

Figure 9:
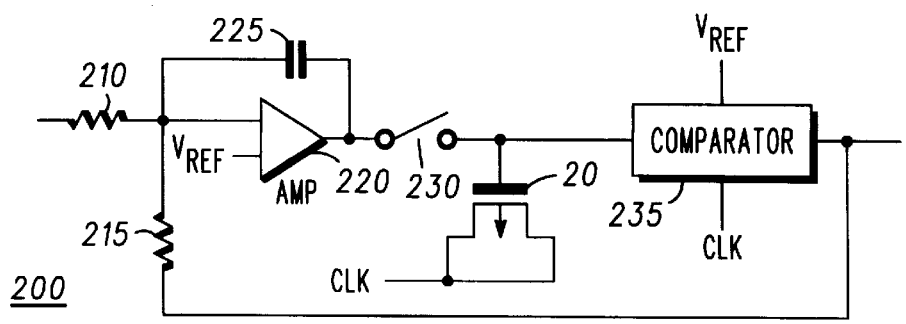
FIGS. 9–13 are schematic description of a sigma-delta modulators having a capacitor, according to a preferred embodiment of the invention.
Figure 11:
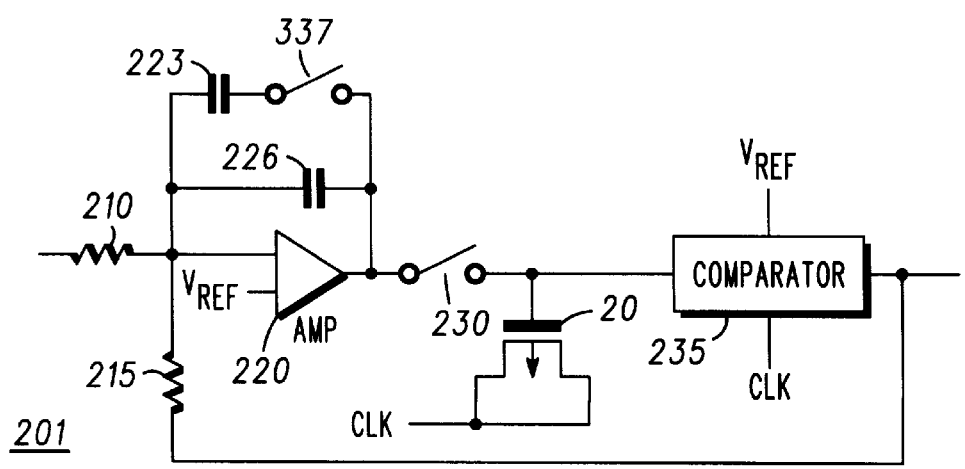

FIGS. 9 and 11 are schematic description of a sigma-delta modulators 200 and 201 having a capacitor and an isolator, according to a preferred embodiment of the invention. Sigma delta modulator 201 of FIG. 11 is analogues to sigma delta modulator 200 of FIG. 9, but has an additional switch SWS3 337 and capacitor C3 223.

Sigma-delta modulator 200 comprises of capacitor CT1 20, isolator SWS 220, integrator 240 and comparator 235. Integrator 240 further comprises of operational amplifier (i.e.—amplifier) 220, charge capacitor C1 225 and voltage to current converter R1 210. Amplifier 220 has two inputs and an output. The first input of amplifier 220 is adapted to receives a reference voltage Vref. Conveniently Vref=Vcc/2. The second input of amplifier 220 is coupled to R1 210 for receiving an input current Iin, derived from an input signal Vin. Capacitor C1 is coupled in parallel to amplifier 220, one of capacitor C1 255 ends is coupled to the second input of amplifier 220 and another end is coupled to the output of amplifier 220. During a first phase of operation, Integrator 240 receives Vin, converts it into current Iin, that is used to charge C1 225.

The output of amplifier 220 is coupled to one end of isolator SWS 230, and the other end of SWS 230 is coupled to the gate of CT1 20. The substrate of CT1 20 is coupled to the ground, the drain and source of CT1 20 are adapted to receive a CLK control signal. CT1 20 and isolator are used to amplify the output voltage of integrator 240. While SWS 230 is closed, CT1 20 is charged to a voltage level that equals the output voltage of integrator 240. SWS 230 is controlled by control signal 230, so thah when CLK is high SWS is opened. The gate of CT1 20 is coupled to a first input of comparator 235, A second and third inputs of comparator 235 are adapted to receive Vref and control signal CLK, so that when CLK is high the voltage level at the gate of CT1 20 is compared to Vref. Comparator 235 outputs an digital output signal reflecting the comparison, the digital output signal is provided as an output signal of sigma delta modulator 200 and is also sent, via feedback voltage to current converter R2 215 to the second input of amplifier 220.

Sigma delta modulator 201 has an additional switch SWS3 337 and capacitor C3 223 for allowing the voltage at the output of amplifier 220 to track changes at a relatively high rate so that at the end of a sample stage of comparator 235 (just before SWS 230 is opened) the output voltage at the output of amplifier 220 will be the substantially equal to the output voltage of amplifier 220 at the end of the hold stage (just before SWS 230 is to be closed) had there not been any switching. When SWS 230 is opened SWS3 337 is closed, and capacitor C3 233 is charged in a manner that the output voltage of amplifier 220 does not substantially change during the hold stage. SWS3 337 and C3 223 allow comparator 235 to perform a more accurate comparison.

Figure 12:
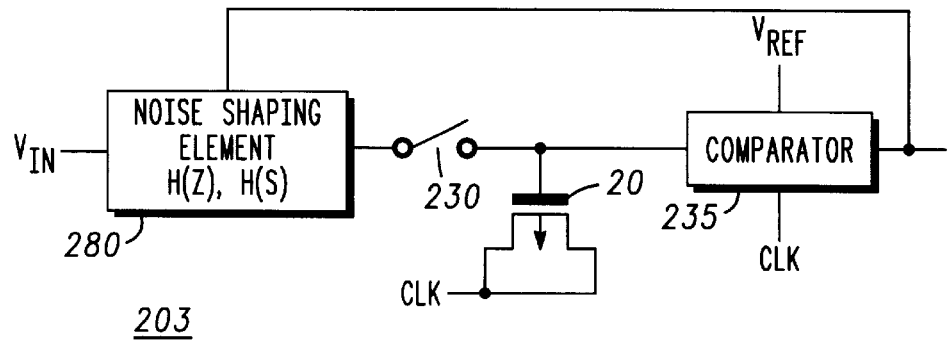

Sigma delta modulator 203 of FIG. 12 comprises of a noise shaping element 280, SWS 230, CT1 20 and comparator 235. Noise shaping element can be of any level, it can comprises of a discrete noise shaping elements, of continuous noise shaping elements and a mixture of both.

Noise shaping element 280 has an first input for receiving an input signal Ain, a second input for receiving CLK, a third input for receiving an output signal from comparator 235 and an output for outputting sigma delta modulated signals.

The output of noise shaping element 280 is coupled to one end of isolator SWS 230 and the other end of SWS 230 is coupled to the gate of CT1 20. The substrate of CT1 20 is coupled to the ground, the drain and source of CT1 20 are adapted to receive a CLK control signal. CT1 20 and isolator are used to amplify the output voltage of integrator 240. While SWS 230 is closed, CT1 20 is charged to a voltage level that equals the output voltage of integrator 240. SWS 230 is controlled by control signal 230, so that when CLK is high SWS is opened. The gate of CT1 20 is coupled to a first input of comparator 235, A second and third inputs of comparator 235 arc adapted to receive Vref and control signal CLK, so that when CLK is high the voltage level at the gate of CT1 20 is compared to Vref. Comparator 235 outputs an digital output signal reflecting the comparison, the digital output signal is provided as an output signal of sigma delta modulator 203 and is also sent to the third input of noise shaping element 280.

Figure 10:
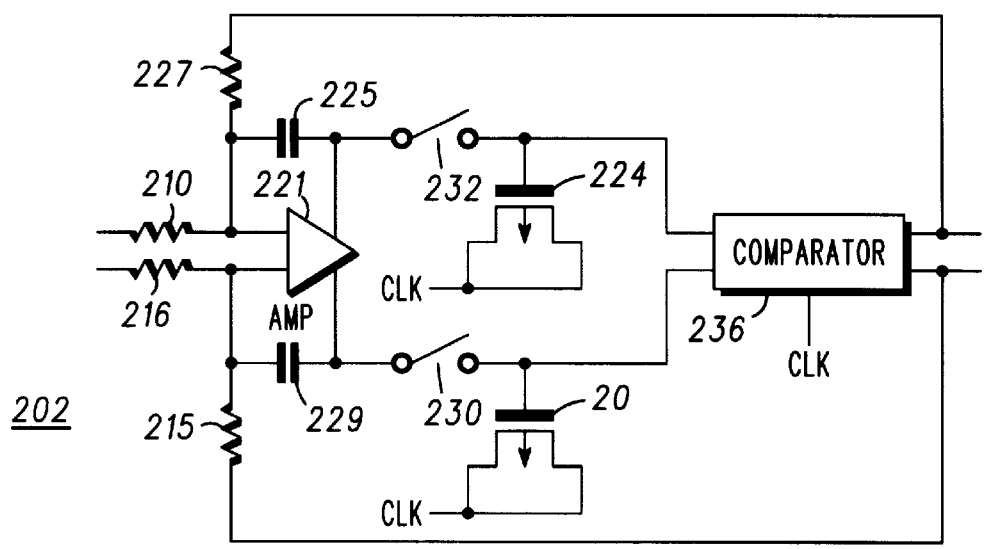

FIG. 10 is a schematic description of a differential sigma delta modulator 202. Sigma delta modulator 202 is analogues to sigma delta 200 of FIG. 9 but has two differential inputs, two differential outputs and additional elements: capacitor C5 229, analogues to C1 225; voltage to current converter R3 216, CT4 224 analogues to CT1 20, SWS2 232 analogues to SWS 230, amplifier 220 of FIG. 9 is replaced by a differential amplifier 221, comparator 235 of FIG. 9 is replaced by differential comparator 236.

Sigma delta modulator 202 has two symmetrical portions, the first portion of sigma delta modulator 202 comprising: R1 210, C1 225, R6 227, SWS2 232 CT4 224, a first portion of differential comparator 236 and differential amplifier 221. A second portion of sigma delta modulator 202 comprising: R3 216, C5 229, CT1 20 SWS 230 and a second portion of differential comparator 236 and of differential amplifier 221. Each of two portions is analogues to sigma delta modulator 200 of FIG. 9 but sigma delta 202 modulates and amplifies the difference between the two input signals. Conveniently, a control unit (not shown) is coupled to the differential outputs and inputs of differential amplifier 221 to sense when an output signal common mode level is either higher than a first threshold or lower than a second threshold, indicating that one of the output signals of the differential amplifier is to be clipped when being amplified by SWS2 232 CT4 224 or SWS 230 and CT1 20 and accordingly to decrease the differential input signals accordingly.

Figure 13:
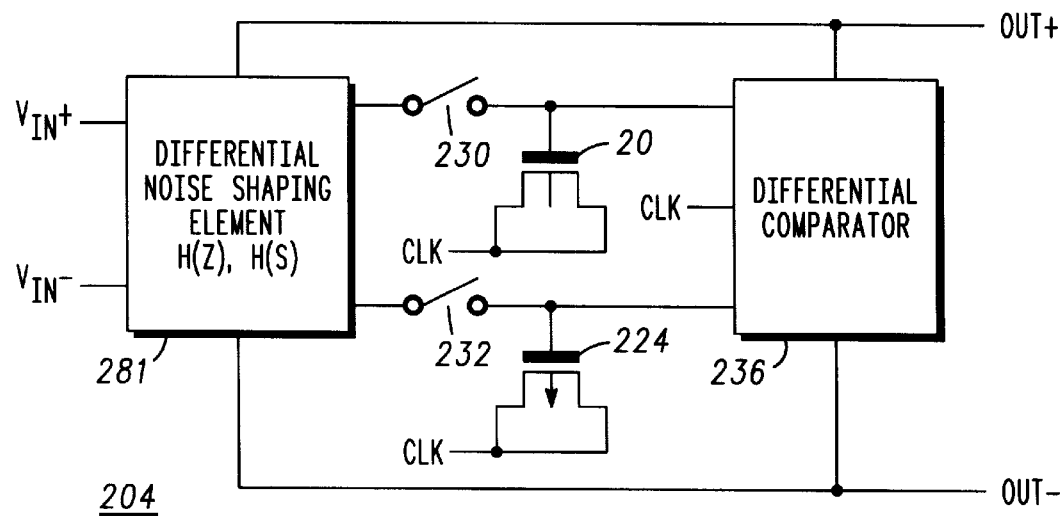

FIGS. 12 and 13 are schematic descriptions of sigma delta modulator 203 and 204, according to a preferred embodiment of the invention. Sigma delta modulator 203 is analogues to sigma delta modulator 200 but instead of integrator 240 has a noise shaping element 280. Noise shaping element 280 can have either a discrete or a continuous transfer function. Noise shaping element 280 can be of first order or of higher order. Noise shaping element 280 can be an integrator, but this is not necessary.

Sigma delta modulator 203 comprising: noise shaping element 280, comparator 235, switch SWS 230, feedback loop 290 and capacitor CT1 20. Noise shaping element 280 can have either a discrete or a continuous transfer function. It can be of first order or of higher order. Noise shaping element 280 receives an analog signal Ain, that undergoes a noise shaping process. An output signal of noise shaping element 280 is provided, via SWS 230, to a gate of CT1 20. When CLK is high SWS 230 is opened and CT1 20 performs a voltage shift, as described in accordance with FIGS. 2–6. The amplified voltage is provided to comparator 235 and is being compared to a reference signal Vref. The output signal of comparator 235 is provided as a sigma delta output signal and is also provided to feedback loop 290 and to noise shaping element 280.

Sigma delta modulator 204 comprising: differential noise shaping element 281, SWS2 932, CT4 224, CT1 20 SWS 230 and differential comparator 236.

Sigma delta modulator 204 is analogues to sigma delta modulator 202 but instead of integrator 240 has a differential noise shaping element 281. Differential noise shaping element 281 can have either a discrete or a continuous transfer function. Differential noise shaping element 281 can be of first order or of higher order. Differential noise shaping element 281 can be a differential integrator, but this is not necessary. Sigma delta modulator 204 receives, generates and provides differential input and output signals (Vin+, Vin−, OUT+, OUT−).

Differential noise shaping element 281 receives two input signals that undergo a noise shaping process. Two output signals of differential noise shaping element 281 are provided, via SWS 230 and SWS2 232, to a gate of CT1 20 and a gate of CT4 224 accordingly. When CLK is high SWS 230 and SWS2 232 are opened and CT1 20 and CT4 224 perform a voltage shift, as described in accordance with FIGS. 2–6. The two amplified voltages are provided to differential comparator 236 to be compared to each other. Two output signals of differential comparator 236 are provided as a sigma delta output signal and are also provided to feedback loops and to differential noise shaping element 280.

Thus, there has been described herein an embodiment including at least one preferred embodiment of an improved voltage shifter/amplifier, a sigma delta modulator having an improved voltage shifter/amplifier and a method for amplifying/performing a voltage shift. It will be apparent to those skilled in the art that the disclosed subject matter may be modified in numerous ways and may assume many embodiments other than the preferred form specifically set out and described above. Accordingly, the above disclosed subject matter is to be considered illustrative and not restrictive, and to the maximum extent allowed by law, it is intended by the appended claims to cover all such modifications and other embodiments which fall within the true spirit and scope of the present invention. The scope of the invention is to be determined by the broadest permissible interpretation of the following claims and their equivalents rather than the foregoing detailed description. In the claims the term "voltage shifter" is used to denote both a voltage shifter and an amplifier.

We claim:

1. A voltage shifter comprising a capacitor and an isolator; the isolator is being coupled to the capacitor;

wherein the capacitor is adapted to receive a control signal, to be charged by an input signal, and to provide an output signal;

wherein the capacitor has a capacitance that is responsive to a level of the control signal, and a change in the capacitance of the capacitor forces a change in a level of the output signal; and wherein the isolator is adapted to electrically isolate the capacitor when the capacitance is changed.

2. The voltage shifter of claim 1 wherein the output signal reflects the input signal and a change in the capacitance of the capacitor.

3. A voltage shifter comprising a capacitor and an isolator; the isolator is being coupled to the capacitor, the capacitor is adapted to be charged by an input signal, to receive a control signal and to provide an output signal, the capacitor comprising of:

an insulator layer;

a diffusion layer, coupled to the insulator layer;

a substrate, coupled to the insulator and to the diffusion layer;

a conductive layer, coupled to the isolator, wherein a capacitance between the conductive layer, the diffusion layer and the substrate is responsive to a the control signal and the input signal; and wherein the isolator is adapted to electrically isolate the capacitor when the capacitance of the capacitor is changed.

4. The voltage shifter of claim 3 wherein the capacitor is adapted to produce at least a first and a second electrically charged regions within the substrate, in response to the control signal and to the input signal;

wherein there is a first capacitance between the conductive layer and the first electrically charged region and there is a second capacitance between the conductive layer and the second electrically charged region; and wherein the first and second capacitance are responsive to the control signal and to the input signal.

5. A voltage shifter comprising a capacitor and an isolator; the isolator is coupled to the capacitor;

wherein the capacitor is comprised of a substrate, a gate and a drain; the gate is adapted to receive an input signal and to provide an output signal, the drain is adapted to receive a control signal, wherein the substrate is adapted to produce at least a first and a second electrically charged regions, in response to the control signal and to the input signal;

wherein there is a first capacitance Cgf between the gate and the first electrically charged region, and there is a second capacitance Cgs between the gate and the second electrically charged region, Cgf and Cgs are responsive to the input signal and to the control signal and are adapted to be charged by an input signal;

wherein a change in either one of Cgf and Cgs forces a change in the level of an output signal provided by the gate of the capacitor; and wherein the isolator is adapted to electrically isolate the capacitor when either one of Cgf and Cgs is changed.

6. The voltage shifter of claim 5 wherein the capacitor further comprising of a source, the source is coupled to the substrate, and is adapted to receive the control signal.

7. The voltage shifter of claim 6, wherein the capacitor is adapted to operate in at least an inversion mode and a depletion mode, wherein in an inversion mode Cgf is charged by the input signal, and when the capacitor changes its mode from an inversion mode to a depletion mode Cgf is discharged and Cgs is charged.

8. A sigma delta modulator comprising:

a noise shaping element, having an input and an output, the noise shaping element is adapted to receive an analog input signal, to perform a noise shaping process and provide an noise shaped signal;

a voltage shifter, having an input and an output, the input of the voltage shifter is coupled to the output of the noise shifting element, the output of the voltage shifter is coupled to a first input of an comparator, the voltage shifter further comprises a capacitor and an isolator; the isolator is coupled to the capacitor, the capacitor is adapted to receive a control signal, to be charged by the noise shaped signal, and to provide an voltage shifter output signal to a comparator; the capacitor has a capacitance that is responsive to a level of the control signal, and a change in the capacitance of the capacitor forces a change in a level of the voltage shifter output signal, the isolator is adapted to electrically isolate the capacitor when the capacitance is changed; and a comparator, having an output for providing a sigma delta modulator output signal the output of the comparator is coupled, via a feedback loop to the noise shaping element, the comparator is adapted to receive the voltage shifter output signal, the control signal and the reference voltage and provide the sigma delta modulator output signal reflecting a comparison between the voltage shifter output signal and the reference voltage; the comparison is initiated by the control signal.

9. The sigma delta modulator of claim 8 wherein the noise shaping element is an integrator, having an input and an output, the integrator is adapted to receive an analog input signal, to integrate the analog input signal and to provide an integrated analog signal.

10. The sigma delta modulator of claim 9 wherein the integrator further comprising an operational amplifier, a charge capacitor and a voltage to current converter; the amplifier has a first input and a second input and an output, the first input of the amplifier is adapted to receive the reference voltage, the second input of the amplifier is coupled to the voltage to current converter for receiving an input current, derived from an input signal, one end of the charge capacitor is coupled to the second input of the amplifier and another end of the charge capacitor is coupled to the output of the amplifier; and wherein the second input of the amplifier is coupled to the feedback loop.

11. The sigma delta modulator of claim 10 wherein the capacitor comprising:

an insulator layer;

a diffusion layer, coupled to the insulator layer;

a substrate, coupled to the insulator and to the diffusion layer; and a conductive layer, coupled to the isolator, wherein a capacitance between the conductive layer, the diffusion layer and the substrate is responsive to a the control signal and the integrated analog signal.

12. The sigma delta modulator of claim 11 wherein the capacitor is adapted to produce at least a first and a second electrically charged regions within the substrate, in response to the control signal and to the integrated analog signal;

wherein there is a first capacitance between the conductive layer and the first electrically charged region and there is a second capacitance between the conductive layer and the second electrically charged region; and wherein the first and second capacitance are responsive to the control signal and to the integrated analog signal.

13. The sigma delta modulator of claim 8 wherein the capacitor comprising a a substrate a gate and a drain;

wherein the gate is adapted to receive the integrated analog signal and to provide an voltage shifter output signal, the drain is adapted to receive the control signal;

wherein the substrate is adapted to produce at least a first and a second electrically charged regions, in response to the control signal and to the integrated analog signal;

wherein there is a first capacitance Cgf between the gate and the first electrically charged region, and there is a second capacitance Cgs between the gate and the second electrically charged region, Cgf and Cgs are responsive to the integrated analog signal and to the control signal and are adapted to be charged by the integrated analog signal;

wherein a change in either one of Cgf and Cgs forces a change in the level of the level shifter output signal provided by the gate of the capacitor; and wherein the isolator is adapted to electrically isolate the capacitor when either one of Cgf and Cgs is changed.

14. The sigma delta modulator of claim 13 wherein the capacitor is adapted to operate in at least an inversion mode and a depletion mode, wherein in an inversion mode Cgf is charged by the integrated analog signal, and when the capacitor changes its mode from an inversion mode to a depletion mode, Cgf is discharged and Cgs is charged.

15. A method for charging a capacitor and performing a voltage shift, the method comprising the steps of:

providing an input signal to the capacitor, and charging the capacitor;

isolating the capacitor, providing a control signal that changes the capacitance of the capacitor and changing a voltage across the capacitor.

16. The method of claim 15 further comprising a step of providing an output signal reflecting the voltage across the capacitor.

* * * * *

UNITED STATES PATENT AND TRADEMARK OFFICE
CERTIFICATE OF CORRECTION

PATENT NO.    : 6,275,178 B1
DATED         : August 14, 2001
INVENTOR(S)   : Vladimir Koifman et al.

It is certified that error appears in the above-identified patent and that said Letters Patent is hereby corrected as shown below:

Column 8,
Line 46, delete "of"
Line 53, delete "a"
Line 60, change "regions" to -- region --

Column 9,
Line 22, delete "of"
Line 28, insert -- , -- after mode
Lines 38 and 42, change "an" to -- a --
Line 50, insert -- , -- after signal
Line 64, change "comprising" to -- comprises --

Column 10,
Lines 10 and 30, change "comprising" to -- comprises --
Line 32, change "an" to -- a --

Signed and Sealed this

Seventh Day of May, 2002

Attest:

Attesting Officer

JAMES E. ROGAN
Director of the United States Patent and Trademark Office